United States Patent
Barmscheidt et al.

(10) Patent No.: US 9,849,848 B2
(45) Date of Patent: Dec. 26, 2017

(54) MOTOR VEHICLE COMPONENT SUPPORT AND METHOD FOR THE PRODUCTION THEREOF

(71) Applicant: Kiekert Aktiengesellschaft, Heiligenhaus (DE)

(72) Inventors: Christian Barmscheidt, Duisburg (DE); Carsten Fuchs, Dusseldorf (DE)

(73) Assignee: Kiekert Aktiengesellschaft, Heiligenhaus (DE)

( * ) Notice: Subject to any disclaimer, the term of this patent is extended or adjusted under 35 U.S.C. 154(b) by 475 days.

(21) Appl. No.: 14/404,755

(22) PCT Filed: May 25, 2013

(86) PCT No.: PCT/DE2013/000290
§ 371 (c)(1),
(2) Date: Dec. 1, 2014

(87) PCT Pub. No.: WO2013/178212
PCT Pub. Date: Dec. 5, 2013

(65) Prior Publication Data
US 2015/0145327 A1    May 28, 2015

(30) Foreign Application Priority Data

May 30, 2012   (DE) .................. 10 2012 010 722

(51) Int. Cl.
*B60R 16/03*    (2006.01)
*E05B 81/54*    (2014.01)
(Continued)

(52) U.S. Cl.
CPC .............. *B60R 16/03* (2013.01); *E05B 81/54* (2013.01); *E05B 85/02* (2013.01); *H05K 3/202* (2013.01);
(Continued)

(58) Field of Classification Search
CPC ......... B60R 16/03; E05B 81/54; E05B 85/02; H05K 3/202; H05K 3/222;
(Continued)

(56) References Cited

U.S. PATENT DOCUMENTS 3,184,674 A * 5/1965 Garwin .................. G11C 11/44
                                                                327/574
5,014,904 A * 5/1991 Morton ................ H05K 1/0204
                                                                228/123.1
(Continued)

FOREIGN PATENT DOCUMENTS

DE        42 38 867 A1    5/1994
DE        101 29 118 A1   12/2002
(Continued)

OTHER PUBLICATIONS

International Search Report for corresponding patent application No. PCT/DE2013/000290 dated Aug. 20, 2014.

*Primary Examiner* — Brandon S Cole
(74) *Attorney, Agent, or Firm* — Renner, Otto, Boisselle & Sklar, LLP

(57) ABSTRACT

The invention relates to a motor vehicle component support, in particular a motor vehicle door lock (1), and to a method for the production thereof. Said motor vehicle component support is equipped with a strip conductor structure (3) composed of several strip conductors (7). According to the invention, the strip conductor structure (3) comprises at least two conductor strip sub-structures (3a, 3b) which are electrically interconnected by means of at least one connecting element (8) which is applied later.

10 Claims, 4 Drawing Sheets

Figure 1:
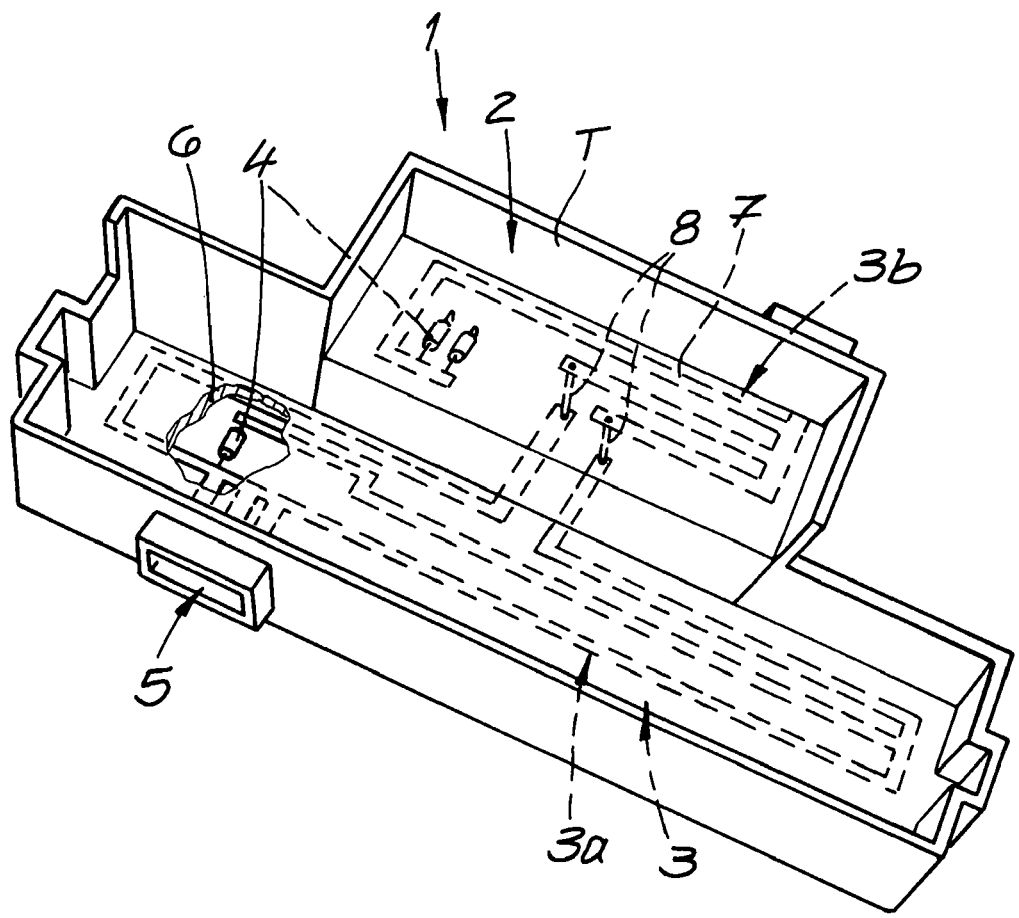

(51) Int. Cl.
*E05B 85/02* (2014.01)
*H05K 3/20* (2006.01)
*H05K 3/22* (2006.01)
*H05K 1/02* (2006.01)

(52) U.S. Cl.
CPC ........... *H05K 3/222* (2013.01); *H05K 1/0284* (2013.01); *H05K 2201/09118* (2013.01); *H05K 2201/10363* (2013.01); *H05K 2203/1316* (2013.01)

(58) Field of Classification Search
CPC .......... H05K 2201/09118; H05K 2201/10363; H05K 2203/1316
USPC ............................ 307/9.1–10.8; 361/600–837
See application file for complete search history.

(56) References Cited

U.S. PATENT DOCUMENTS

| | | | |
|---|---|---|---|
| 5,416,274 A | 5/1995 | Ushiyama et al. | |
| 5,555,766 A * | 9/1996 | Johnson | G01P 1/023 361/280 |
| 5,764,050 A * | 6/1998 | Ellmann | F16C 32/0446 104/284 |
| 5,938,455 A | 8/1999 | Glovatsky et al. | |
| 6,160,708 A * | 12/2000 | Loibl | B60R 16/0239 174/266 |
| 6,354,868 B1 * | 3/2002 | Korczynski | B60R 16/0238 361/826 |
| 2004/0033724 A1 * | 2/2004 | Felgueroso | H02K 5/22 439/638 |
| 2008/0062711 A1 * | 3/2008 | Veenstra | B29C 45/14639 362/546 |
| 2008/0129204 A1 | 6/2008 | Tsukamoto et al. | |
| 2009/0154182 A1 * | 6/2009 | Veenstra | B60Q 1/2696 362/487 |
| 2010/0188281 A1 * | 7/2010 | Hayata | H01P 5/107 342/118 |
| 2011/0051068 A1 | 3/2011 | Kamon et al. | |

FOREIGN PATENT DOCUMENTS

| | | |
|---|---|---|
| DE | 102 47 567 A1 | 4/2004 |
| EP | 1 887 844 A2 | 2/2008 |
| JP | H02 99571 U | 8/1990 |
| JP | H06 11262 U | 2/1994 |
| JP | H11 176497 A | 7/1999 |
| JP | 2005 033882 A | 2/2005 |
| WO | 01/57960 A1 | 8/2001 |
| WO | 03/041227 A1 | 5/2003 |

* cited by examiner

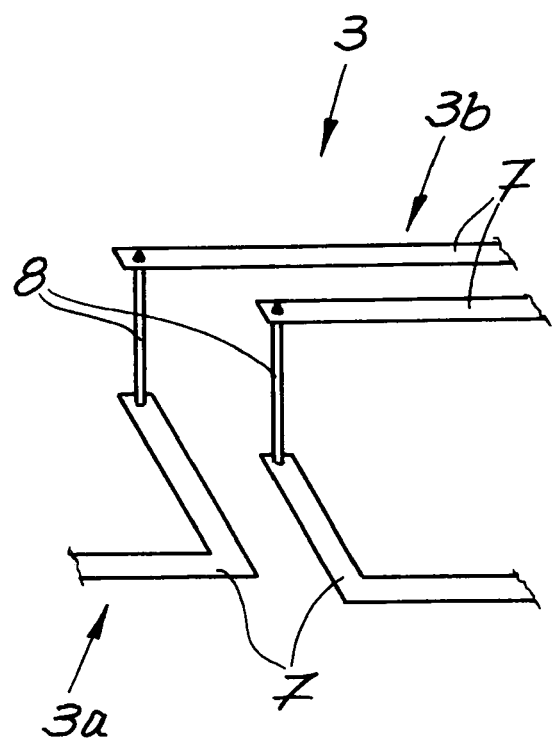

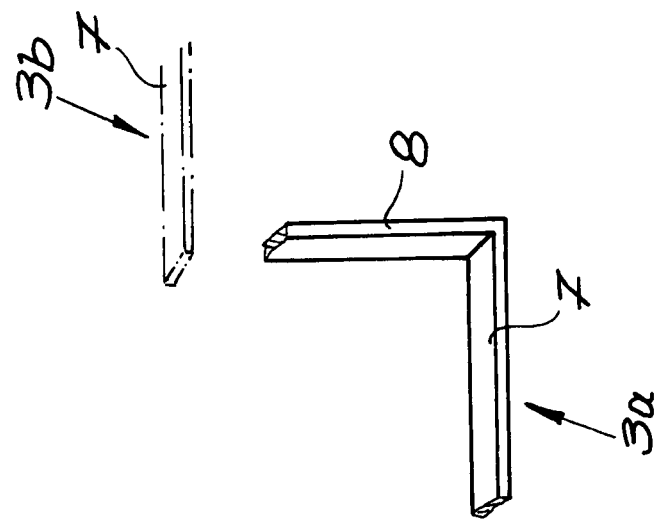
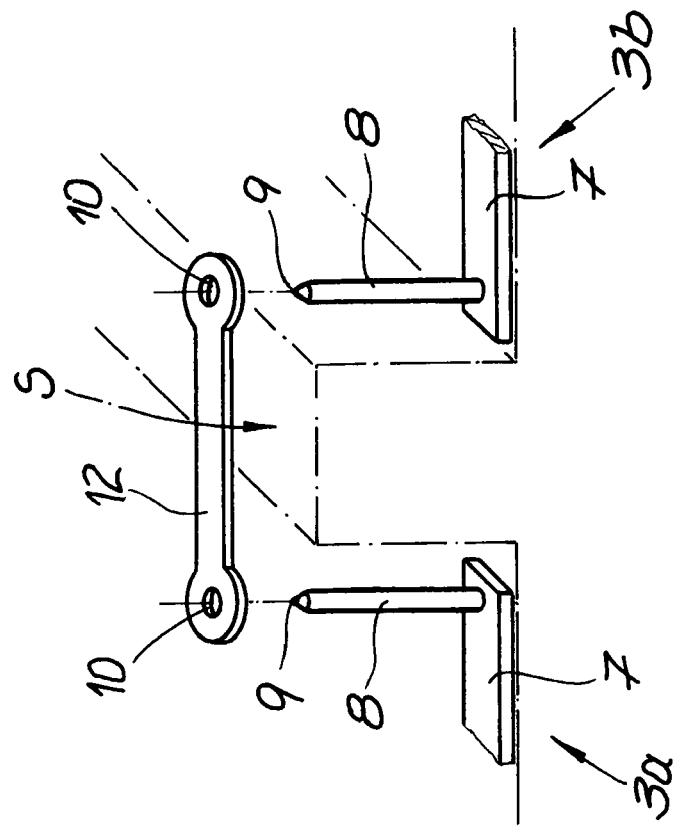

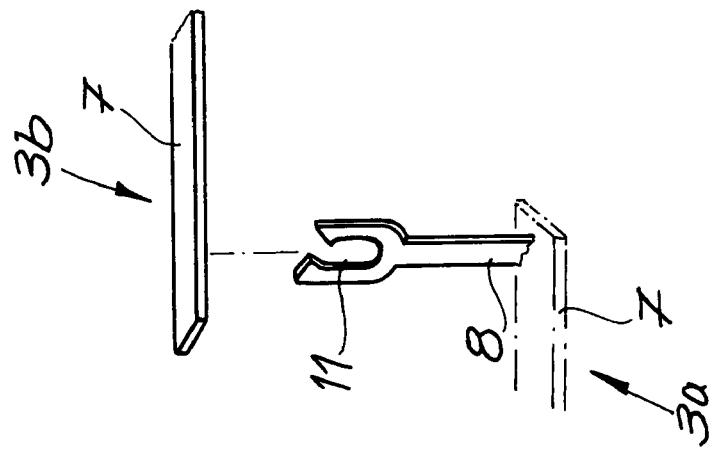
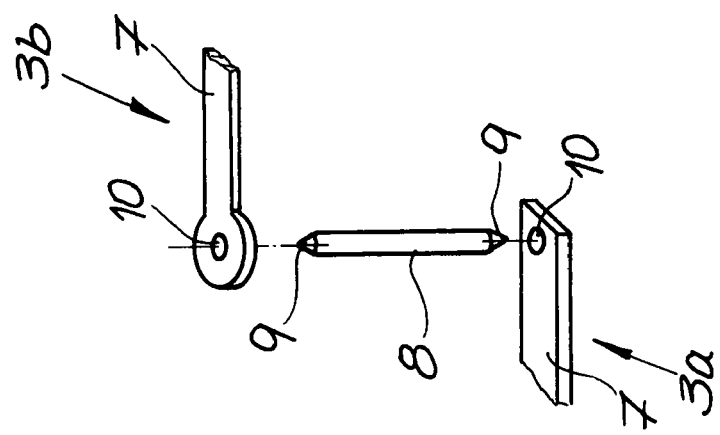

MOTOR VEHICLE COMPONENT SUPPORT AND METHOD FOR THE PRODUCTION THEREOF

The invention relates to a motor vehicle component support, in particular a motor vehicle component support with a strip conductor structure consisting of several strip conductors.

A motor vehicle component support and in particular motor vehicle door lock housing containing strip conductor structures are typically used when one or several electric/electronic components are accommodated by said motor vehicle component support and are connected with the aid of the strip conductor structure. Electric or electronic components generally refers to such components with the aid of which, for instance, the location of levers contained in the lock can be determined. They also include electro-mechanical components such as micro switches, frictional contacts and/or electric motors.

The respective motor vehicle component support can be inserted in the housing of a motor vehicle door lock, connected to the described components and then covered with an electrically insulating compound. The compound can be a casting resin. Alternatively or in addition, the motor vehicle component support can also be part of the motor vehicle door housing.

DE 10 2009 002 902 A1 discloses a lock housing part with an inserted lead frame forming the strip conductor structure. The strip conductors contain connecting pins leading into the inside of the lock housing part. In this way, a lock housing allowing a considerable amount of design options can be provided, which is also economical to produce.

In a method for producing a support for electric components according to DE 102 47 567 A1, strip conductors stamped out of sheet metal are covered during the production of the support using a plastic injection molding process and are equipped with electronic components. The components are added prior to injection molding.

EP 1 527 967 B1 also discloses a method for the production of a support element of the lock of a motor vehicle. In this arrangement, the strip conductors of different layers are connected to each other via connection sections in such a way that they form a single body. After securing the individual layers of the strip conductors to an intermediate element, the connection sections are subjected to a stamping operation. In other words, the connection sections only serve as mechanical stabilization ridges for the strip conductor structure, do however, have to be severed for the subsequent function in order to avoid short circuits, unwanted electrical connections, etc.

In a method for embedding at least one flexible strip conductor foil in plastic, as disclosed in EP 1 231 824 A2, the respective flexible strip conductor foil is arranged in a prefabricated stiffening element, securing it against bending. The strip conductors and the stiffing element are then covered by plastic using injection molding.

Publication DE 10 2005 049 975 B4 also to be considered as prior art, discloses a component support containing a strip conductor structure. The strip conductor structure contains tinplate.

Previous attempts of providing a motor vehicle component support with a strip conductor structure consisting of several strip conductors have their limits when complex strip conductor structures are to be provided and/or several strip conductor structures for one and the same type of motor vehicle component support or motor vehicle door lock housing, allowing the implementation of different configuration/expansion stages. Until now, such different designs could only be implemented at considerable cost. The invention aims to remedy this.

The invention is based on the technical problem of further developing such a motor vehicle component support in such a way that the production of, in particular, the strip conductor structure is simplified and different versions of the strip conductor structure can be easily implemented, taking into consideration different extension stages.

In order to solve this technical problem, a generic motor vehicle component support and, in particular, a motor vehicle door lock of the invention is characterized by the strip conductor structure comprising at least two conductor strip sub-structures, which are electrically interconnected by means of at least one connecting element which is applied later.

In other words, in the invention, the strip conductor structure which is more or less complex depending on the functionality and configuration level, is purposely divided into at least two strip conductor structures. These strip conductor structures generally have a simplified design. As part of the invention, such a simplified design means for instance that the strip conductor structure only consists of strip conductors arranged on one level.

In order to be able to also realize complex strip conductor structures as part of the invention, such as structures containing two or more levels, the individual strip conductor structure each arranged only on one level are electrically connected via the one or more connecting elements applied later. In other words, the subsequently applied connecting elements only ensure that also complex three-dimensional designs of the strip conductor structure can be produced and do not have to be implemented as a lead frame from the outset.

In another option for simplifying the strip conductor structure by the at least two strip conductor structures, a strip conductor structure has a certain shape, whilst the other second strip conductor structure contains a shape connecting thereto. In this way, the strip conductor structure composed of several strip conductors can also be adapted to complex geometries of the motor vehicle component support or motor vehicle door lock housing with, for instance, different chambers for accommodating the strip conductor structure. In this case the individual strip conductor structures are not necessarily arranged on different levels but are connected to each other on one level. The design is, however, simplified by the fact that the respective simplified strip conductor structure is accommodated, for instance in a separate chamber of the motor vehicle door lock, in which it is arranged.

It is in any case clear that as part of the invention, bends are not required on or in a strip conductor, as shapes of the strip conductor structure at different levels are realized by the invention in such a way that one strip conductor structure belongs, for instance, to each level and that these several strip conductor structures are only subsequently conductively connected to the complex strip conductor structure with the aid of one or several connecting elements. As a result, the individual strip conductor structures do in most cases have a simple geometry, for instance in form of a defined level area and can thus be simply, easily and cost effectively produced, by for instance stamping.

In addition, the design of the invention offers the option of, for instance, the first strip conductor structure being designed as a main strip conductor structure, whilst the second or each second strip conductor structure can be designed as an expansion strip conductor structure. The main strip conductor structure is regularly used in all versions of the motor vehicle door lock to be realized. The second or each second strip conductor structure or extension strip conductor structure is, on the other hand only used if and only when the door lock to be produced contains optional additional functions It is thus, for instance, feasible to provide a motor vehicle door lock with a central locking function and equip it in this context with a respectively designed main strip conductor structure. If this motor vehicle door lock should now, for instance, be equipped with an additional "closing function" or the function "electric opening", the electric/electronic components required for these additional functions are contacted with the respective extension strip conductor structures and are electrically connected to the main strip conductor structure. In this way, a cost effective and flexible production of the motor vehicle component support or motor vehicle door lock housing is provided, which can be precisely adjusted to the individual circumstances. These are the main advantages of the invention.

In order to implement the electric connection of the two strip conductor sub-structures in detail, the connecting element is advantageously connected to a first strip conductor structure or is designed as a connectable pin. This pin can then be mechanically coupled to a second strip conductor sub-structure to produce the electrical connection. As part of this arrangement, the pin can be connected to a first strip conductor sub-structure. This (permanent) connection can be realized in different ways as a mechanical connection. These include, for instance, welded connection, termination clamp, soldered connection, clamping/crimping connection, cold-welding connection or comparable mechanical connection producing, at the same time, the electrical contact between the respective strip conductor and the pin. Alternatively or in addition, the pin can also be designed as a formed component of the respective strip conductor. In this case, the pin is designed on the strip conductor in such a way that the strip conductor is, for instance bent down or over at the end.

The pin connected to the first strip conductor sub-structure is in any case then mechanically coupled to the second strip conductor structure, as described, in order to provide the desired electrical connection between the two strip conductor sub-structures. The mechanical coupling between the pin and the second strip conductor sub-structure can again be provided by welded connection, termination clamp, soldered connection, clamping/crimping connection, cold-welding connection or comparable mechanical connection. In all of these cases, the pin is connected to the first strip conductor structure using the described mechanical connection and/or single component of a strip conductor of the first strip conductor sub-structure. The unit, comprising the first strip conductor sub-structure and the one or several pins, is then mechanically coupled and is then connected to the second strip conductor sub-structure to produce its electrical connection, as described.

Alternatively or in addition the pin can, however, also be designed to be connectable to the first strip conductor sub-structure. In this case, the first connecting element or the pin is in each case mechanically connected to the first strip conductor sub-structure and the second strip conductor sub-structure in order to provide the overall strip conductor structure. This means that the connecting element is designed as a pin connectable to the first as well as the second strip conductor sub-structure. For this purpose, the pin can be connected to the respective strip conductor sub-structure by a fit and, in particular, interference fit. In detail, the fit or interference fit can be provided by the respective pin being pushed in the respective recess or hole of the respective strip conductor up to a stop. This can be done using a press plunger.

This option offers the greatest flexibility. The connecting element can be firmly mounted on the first strip conductor sub-structure and only subsequently connected to the second strip conductor sub-structure. At the same time there is also the option of mechanically coupling both strip conductor sub-structures when combined to the strip conductor structure also to the connecting element. As a result, also complex strip conductor structures with nearly any three-dimensional structure can be provided, by dividing this there-dimensional structure in the example into its different levels and separating them into respective simplified strip conductor sub-structures. These strip conductor sub-structures are then electrically connected to form the complex strip conductor structures with the aid of one or several connecting elements prior to further processing.

According to the method of the invention the complex strip conductor structure produced from the strip conductor sub-structures is generally inserted in a recess of a electrically insulating carrier element and/or in a mold for producing the carrier element, is equipped with electric/electronic components and is then encapsulated by an electrically insulating compound. As part of this process, the electrically insulating carrier element containing the recess can be prefabricated and can then be equipped with the strip conductor structure and the construction elements. It is, however, also possible to produce the carrier elements and the cast compound in one step. In this case, the strip conductor structure equipped with the electric/electronic components is placed in a mold, used also for the production of the carrier element and for casting A thermoplastic material has proven to be advantageous for the carrier element. Preferably this is a polybutylene terephthalate (PBT) and/or a plastic reinforced with glass fiber. As part of the casting process, the invention recommends the use of a thermoplastic material, such as for instance polyethylene (PE).

The strip conductor structure consists in any case of at least two strip conductor sub-structures, electrically connected by at least one subsequently applied connecting element. The complex strip conductor structure provided in this way is then equipped with electric/electronic components. The complex strip conductor structure and also the one or several connecting elements as well as the electric/electronic components are finally covered by the electrically insulating compound. This not only protects said components but also the strip conductor sub-structure and the electrically contacting connecting elements against environmental influences. These are the main advantages of the invention.

Below, the invention is explained in detail with reference to a drawing showing only one example, in which:

FIG. 1 provides a schematic drawing of a motor vehicle component support of the invention in form of a motor vehicle door lock housing, FIG. 2 provides a perspective view of a section of the strip conductor structure accommodated in the motor vehicle door lock housing as shown in FIG. 1 and FIGS. 3A, 3B and 4A, 4B show details of the electric contacts between the individual strip conductor sub-structures.

The figures show a motor vehicle component support, which in the embodiment is a motor vehicle door lock housing 1. The motor vehicle door lock housing 1 contains an indicated recess 2 in a carrier element T, internally accommodating a strip conductor structure 3. The strip conductor structure 3 contains electric/electronic components 4, only indicated in FIG. 1. It also contains a connection socket 5 with the aid of which the strip conductor structure 3 is or can be connected in an electrically conductive manner by, for instance, a control unit inside a motor vehicle body, not displayed or shown. Lastly FIG. 1 also indicates an electrically insulating compound 6 in which the strip conductor structures 3 and the electric/electronic components 4 provided thereon or in electrical contact therewith, are embedded in order to protect the described elements against adverse environmental influences.

The strip conductor structure 3 consists of several strip conductors 7, schematically shown in FIG. 1 and enlarged in the detailed section of FIG. 2. FIG. 2 also shows that, according to the invention, the strip conductor structure 3 comprises at least two strip conductor parts 3a. 3b. A similar arrangement is apparent from FIG. 1.

The figure shows that the strip conductor sub-structure 3a, 3b is subsequently connected in an electrically conductive manner by two connecting elements 8. In this way, the strip conductor sub-structures 3a, 3b can be provided as a simple design compared to the complex strip conductor structure 3. In the shown example, this simplified design means that the individual strip conductor sub-structures 3a, 3b are arranged on different levels, i.e. in the example, the first strip conductor sub-structure 3a and the second strip conductor sub-structure 3b form different levels, spaced apart from each other. Both strip conductor structures 3a, 3b each form a defined level area and not a, for instance, three dimensional structure.

FIGS. 2 to 4 show that the respective connecting element 8 is a pin 8. The pin 8 can be firmly attached to the first strip conductor sub-structure 3a. In this case, the unit 3a, 8 comprising the first strip conductor sub-structure 3a and the connecting pin 8 for the production of the complex and composed (three dimensional) strip conductor structure 3 is subsequently mechanically combined with the second strip conductor sub-structure 3b to form the strip conductor structure 3 or 3a, 8; 3b. This mechanical coupling can be produced using usual mechanical coupling measures, such as welding, soldering, etc., as already described.

The connecting element or pin 8 can also be firmly connected to the first strip conductor sub-structure 3a or its strip conductor 7 in such a way that the respective pin 8 is basically integrated in the strip conductor 7. This can be achieved in the embodiment shown in FIG. 3B by the pin 8 being created or formed by bending or respective reforming of, for instance, one end of the strip conductor 7 of the first strip conductor sub-structure 3a. In all of these described cases, the connecting element or the pin 8 is thus firmly connected to the respective strip conductor 7 of the first strip conductor sub-structure 3a, before the respective unit 3a, 8 consisting of the first strip conductor structure 8 and the one or several pins 8 is mechanically and electrically connected to the strip conductor sub-structure 3b.

Alternatively, it is also possible for the two strip conductor sub-structures 3a, 3b to only be coupled to each other and the respective connecting element 8 during composite manufacture of the strip conductor structures 3. In this case, the connecting element 8 and the first strip conductor structure 3a as well as the second strip conductor structure 3b are connectably designed and are not connected to one of the two strip conductor structures 3a, 3b from the outset.

The connectable design of the connecting element or pin 8 with the respective strip conductor structure 3a, 3b is generally provided by a fit and, in particular, by an interference fit. Such a fit or interference fit is shown in the drawing in FIGS. 3A and 4A. In order to provide for such a fit or interference fit, the pin 8 can be designed with at least one tip 9 inserted in a hole or recess 10 in order to produce the connection. This hole or recess 10 is provided in strip conductor 7.

In order to connect the individual strip conductor sub-structures 3a, 3b, the pin 8 and its associated tip 9 can be inserted in the hole or recess 10. During this process, the hole or recess 10 is widened so that the desired interference fit and thus a fixed mechanical connection is provided. As shown in FIG. 3A, one end of the pin 8 can, for instance, be firmly connected to the strip conductor 7 of the first strip conductor structure 3a. The other end of the pin 8 has the tip 9 so that thus the desired and described connection with the second strip conductor sub-structure 3b and/or a bridging element 12 for bridging a web S in the housing, can be produced. It is, however, also possible to provide the pin 8 with a respective tip 9 on both sides. In this case, the respective strip conductors 7 of the associated strip conductor sub-structure 3a, 3b each contain a hole or recess 10 (see FIG. 3A, 4A).

FIG. 4B shows another embodiment in which a pin 8 can be inserted in a strip conductor 7, using an termination clamp 11, in order to provide the desired mechanical and electrical connection of the pin 8 to the respective strip conductor sub-structure 3a, 3b. The first strip conductor sub-structure 3a can be a main strip conductor structure 3a, used in all embodiments of the motor vehicle door lock housing 1 shown in FIG. 1. In contrast, the second strip conductor sub-structure 3b is designed as an extension strip conductor structure 3b which is only placed in the recess 2 and equipped with the associated components 4 where required.

Such an additional function could for instance be designed as a closing aid, as already described above.

During the production of the motor vehicle component support or of the motor vehicle door lock housing 1, the strip conductor sub-structures 3a, 3b are initially retrospectively electrically connected to each other by the two connecting elements 8 to form the complex composite strip conductor structure 3 or 3a, 8; 3b or 3a; 8; 3b. This complex composite strip conductor structure 3 is then equipped with electrical/electronic components 4. Finally, the arrangement is covered by the electrically insulating compound 6 as shown in FIG. 1 after the strip conductor structure 3 has been inserted in the recess 2 of the electrically insulating carrier element T. The encapsulation and manufacture of the carrier element T or of the component support can be carried out in the same step. This is achieved by placing the strip conductor structure 3 containing the units 4 in a respectively designed injection molding tool.

During injection molding not only the electric/electronic components 4 but also the one or several connecting elements 8 are sealed by the electrically insulating compound. This provides optimum protection against any environmental influences. It goes without saying that the differentiation between the first strip conductor sub-structure 3a and the second strip conductor sub-structure 3b has only been made in the embodiment for the sake of clarity and that the design and functionality of both strip conductor sub-structures 3a, 3b can naturally be exchanged.

The invention claimed is:
1. A motor vehicle door lock housing comprising:
a first strip conductor that extends in a first plane within the housing;

a second strip conductor that extends in a second plane within the housing, the second plane being spaced and separate from the first plane, wherein the first plane and the second plane are vertically stacked; and a connecting element that extends between the first plane and the second plane, the connecting element having a mechanical connection between the connecting element and each of the first strip conductor and the second strip conductor that also provides electrical contact between the connecting element and each of the first strip conductor and the second strip conductor for mechanically and electrically connecting the first strip conductor and the second strip conductor.

2. The motor vehicle door lock housing according to claim 1, wherein the mechanical connection is a welded connection, termination clamp, soldered connection, clamping/crimping connection, or cold-welding connection.

3. The motor vehicle door lock housing according to claim 1, wherein the connecting element is a pin connectable to the first strip conductor and the second strip conductor.

4. The motor vehicle door lock housing according to claim 1, wherein the connecting element is connected to at least one of the first strip conductor and the second strip conductor by an interference fit.

5. The motor vehicle door lock housing according to claim 1, wherein the connecting element is a formed component of at least one of the first strip conductor or the second strip conductor, the connecting element being integral with the first strip conductor or the second strip conductor.

6. The motor vehicle door lock housing according to claim 1, wherein the first strip conductor is a main strip conductor and the second strip conductor is an extension strip conductor.

7. A method of forming a motor vehicle door housing, the method comprising:
   inserting a first strip conductor in a recess of an electrically insulating carrier element, wherein the first strip conductor extends in a first plane;
   inserting a second strip conductor in the recess, wherein the second strip conductor extends in a second plane spaced from the first plane, wherein the first plane and the second plane are vertically stacked; and
   electrically and mechanically connecting the first strip conductor and the second strip conductor with a connecting element that extends between the first plane and the second plane, the connecting element having a mechanical connection between the connecting element and each of the first strip conductor and the second strip conductor that also provides electrical contact between the connecting element and each of the first strip conductor and the second strip conductor.

8. The method according to claim 7 further comprising connecting electrical components to at least one of the first strip conductor and the second strip conductor.

9. The method according to claim 8 further comprising encapsulating the first strip conductor, the second strip conductor, the connecting element, and the electrical components with an electrically insulating compound.

10. The method according to claim 9 further comprising injection molding.

* * * * *